(12) United States Patent
Kurihara et al.

(10) Patent No.: US 6,784,545 B2
(45) Date of Patent: Aug. 31, 2004

(54) SEMICONDUCTOR DEVICE HAVING PAD ELECTRODE CONNECTED TO WIRE

(75) Inventors: Toshimichi Kurihara, Kawasaki (JP); Takahiro Kawabata, Ohtsu (JP); Tetsu Toda, Ohtsu (JP); Shigeki Tsubaki, Ohtsu (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 4 days.

(21) Appl. No.: 10/411,109

(22) Filed: Apr. 11, 2003

(65) Prior Publication Data

US 2003/0214033 A1 Nov. 20, 2003

(30) Foreign Application Priority Data

Apr. 12, 2002 (JP) ........................................ 2002/110874

(51) Int. Cl.[7] ........................ H01L 23/48; H01L 23/52; H01L 29/40
(52) U.S. Cl. ........................ 257/751; 257/773; 257/775
(58) Field of Search ................................ 257/751, 773, 257/775

(56) References Cited

U.S. PATENT DOCUMENTS 5,525,546 A * 6/1996 Harada et al. .............. 438/612
6,538,323 B1 * 3/2003 Sakata et al. ............... 257/737

FOREIGN PATENT DOCUMENTS

| JP | 4-10632 A | 1/1992 |
| JP | 5-055296 | 3/1993 |
| JP | 6-196526 | 7/1994 |
| JP | 2002-76051 | 3/2002 |

* cited by examiner

Primary Examiner—David Nelms
Assistant Examiner—Tu-Tu Ho
(74) Attorney, Agent, or Firm—Sughrue Mion, PLLC

(57) ABSTRACT

In a semiconductor device having a semiconductor substrate, an internal electrode layer is formed on the semiconductor substrate. A barrier metal layer is formed on the internal electrode. An external electrode layer is formed on the barrier metal layer. A pad electrode is made of the internal electrode layer, the barrier metal layer, and the external electrode layer. A wire is electrically connected to the pad electrode. An area of the external electrode layer is set midway between an area of a polymerization portion of the wire on the pad electrode and a planar area of the barrier metal layer.

8 Claims, 1 Drawing Sheet

SEMICONDUCTOR DEVICE HAVING PAD ELECTRODE CONNECTED TO WIRE

This application claims priority to prior application JP 2002-110874, the disclosure of which is incorporated herein by reference.

BACKGROUND OF THE INVENTION

The present invention broadly relates to a semiconductor device having a semiconductor substrate and a pad electrode which is formed thereon and is electrically connected to a wire. In particular, the present invention relates to a semiconductor device having improved electrical connection between the pad electrode and the wire.

A semiconductor device is manufactured by forming each semiconductor element in a predetermined region divided on a semiconductor wafer, electrically connecting the essential part of each semiconductor element with a pad electrode formed on the surface of each region, and cutting the semiconductor wafer into separate individual semiconductor pellets. Using the semiconductor pellet, the semiconductor element and an external device can be electrically connected via the pad electrode. In a semiconductor device having the semiconductor pellet coated with resin to protect from an external force or corrosive gases, the pad electrode is generally connected with an external electrode exposed on the outer surface of the coating resin via the wire.

In this type of semiconductor device, aluminum or an alloy containing aluminum as a main component is generally used as the material for the pad electrode for resistively connecting the pad electrode to a semiconductor element. A metal or an alloy of high electrical conductivity, such as gold, copper or aluminum, is used as the wire. The material and diameter of the wire is determined by primarily considering electrical characteristics, such as operating current, cost and reliability. If lower resistance and reliability are required, gold is generally used.

Now, referring to FIG. 1, description will be made of a related semiconductor device.

In FIG. 1, reference numeral 1 denotes a semiconductor substrate on which a semiconductor element is formed. The semiconductor element includes an active device, such as a transistor, and a passive device, such as a resistor or a capacitor, by diffusing impurities in a silicon or compound semiconductor. Although it is not shown, a wiring layer is formed on the surface of the semiconductor substrate 1. On the substrate 1, a protective film 2 is formed. The protective film 2 protectively covers the surface of the semiconductor substrate 1 including the wiring layer. A pad electrode 3 is electrically connected to a semiconductor element in the semiconductor substrate 1. The pad electrode 3 is made of a barrier metal layer 5 and an external electrode layer 6 which are deposited in this order on an internal electrode layer 4 electrically connected to the wiring layer (not shown). Reference numeral 7 denotes a wire externally connected to the pad electrode 3.

The internal electrode layer 4 is formed by making a round opening that has a diameter of, for example, 100 μm, in a part of the protective film 2 covering the semiconductor substrate 1 so as to expose an aluminum-copper alloy layer having a thickness of, for example, a few μm. The barrier metal layer 5 has a multi-layer structure in which layers generally formed of a metal, such as titanium or titanium nitride, or a alloy that has barrier properties are deposited to a predetermined thickness. On the top of the barrier metal layer 5, a layer made of an alloy of aluminum and copper is deposited to form the external electrode layer 6.

The wire 7 is formed by melting an end portion sticking out from the bottom of a metal wire inserted in a capillary (not shown) by electric discharging, thereby forming a ball. The ball is pressed against the pad electrode 3 at the bottom of the capillary to squash the ball. The diameter of a squashed portion 7a is increased to be a few times as large as a wire diameter thereby to increase the joint area so as to secure electrical connection. The diameter of the wire 7 is determined by a maximum permissible current of the semiconductor device, and the diameter of the squashed portion 7a is determined on the basis of the wire diameter.

Meanwhile, the diameter of the pad electrode 3 is set to be larger than the diameter of the squashed portion 7a so as to permit easy wiring bonding. This makes it easy to connect the wire 7 to the pad electrode 3 even if a semiconductor pellet is dislocated.

The pad electrode 3 and the wire 7 are generally connected by thermo-compression bonding, ultrasonic bonding or another connecting method combining the former two. Thereby, the temperature of a connection interface is set at an optimum temperature for the connection.

On the other hand, it is known that, if aluminum is used as the external electrode layer 6 and gold is used as the wire 7, and if the connection interface is subjected to a high temperature during or after the connecting process, an intermetallic compound of gold and aluminum is generated. It is also known that the type and generation ratio of the intermetallic compound varies in dependence upon the temperature of the connection interface.

A purple alloy ($AuAl_2$) is known as purple plague. If the amount of gold is greater than that of the purple plague, a whity alloy ($Au_2Al$) is produced. This alloy exhibits higher electrical resistance and fragility, resulting in deteriorated mechanical strength, which means deteriorated connection strength. Furthermore, the produced intermetallic compound is directly connected between the wire and the semiconductor element, so that it significantly influences the resistance value of the semiconductor device. This poses a problem of an increased ON resistance at an electrode to which major current is supplied as well as an increased DC input resistance at an electrode to which input signals are applied.

In order to solve the above-mentioned problem, Japanese Unexamined Patent Publication (JP-A) No. 4-10632 (prior art) has disclosed a method in which after the wire bonding to a pad electrode of a semiconductor pellet, the semiconductor pellet is maintained at a high temperature before it is subjected to a resin sealing step. More specifically, if the semiconductor pellet is maintained at about 200° C. for about two hours, an alloy of about 80% or more can be produced as a finished product in order to obtain a stable semiconductor device. It has also been disclosed that heating the semiconductor pellet at 200° C. for 200 hours disadvantageously makes the intermetallic compound of aluminum and gold fragile.

According to the prior art described above, the wire is connected to the pad electrode, and then, the pad electrode and the wire are heated at a predetermined temperature for a predetermined time to progress the generation of the intermetallic compound of aluminum and gold so as to stabilize the characteristics of the semiconductor device. According to this prior art, however, the generation of the intermetallic compound cannot be completely finished, and extending the heating time causes the connection interface to be fragile.

When a semiconductor device is repeatedly turned ON and OFF, its temperature repeatedly rises and falls. As a consequence, the joint of a pad electrode and a wire is repeatedly subjected to the stress of expansion and contraction due to thermal expansion. An increase in the resistance of the joint causes the joint to generate heat by itself, further contributing to fragility. This has led to damaged electrical connection of the wire in a relatively short time period.

In the case of a semiconductor device operated at a superhigh frequency in a band ranging from a few hundred MHz to GHz, impedance matching is performed between the semiconductor device and the circuits connected thereto in order to maximize power efficiency. A wire in the semiconductor device constitutes a part of a matching circuit.

If the resistance between the pad electrode and the wire changes with time, the matching condition also changes with time to thereby increase loss. This requires readjustment of external circuits to restore an optimum condition. For this reason, the stability of the joint between the pad electrode and the wire has been an important factor.

SUMMARY OF THE INVENTION

It is therefore an object of the present invention to provide a highly reliable semiconductor device which is capable of stably operating for a long time period without time-dependent fluctuation (change) in the resistance between a wire and a pad electrode.

In a semiconductor device according to an aspect of the present invention, an internal electrode layer is formed on the semiconductor substrate. A barrier metal layer is formed on the internal electrode. An external electrode layer is formed on the barrier metal layer. A pad electrode is made of the internal electrode layer, the barrier metal layer, and the external electrode layer. A wire is electrically connected to the pad electrode. An area of the external electrode layer is set midway between an area of a polymerization portion of the wire on the pad electrode and a planar area of the barrier metal layer.

Preferably, the external electrode layer is formed of aluminum or an alloy containing aluminum as a main component, and the wire is formed of gold or an alloy containing gold as a main component.

Preferably, the area size of the external electrode layer of the pad electrode is set to 1.2 to 10 times of the size of the polymerization portion of the wire.

Preferably, the semiconductor substrate includes a superhigh frequency circuit device. The wire constitutes a part of the superhigh frequency circuit device.

Preferably, the external electrode layer is formed to an island shape on the barrier metal layer, and the area size of the external electrode layer of the pad electrode is set so as to suppress time-dependent fluctuation (change) in the resistance between the wire and the pad electrode.

DESCRIPTION OF THE PREFERRED EMBODIMENTS

Figure 1:
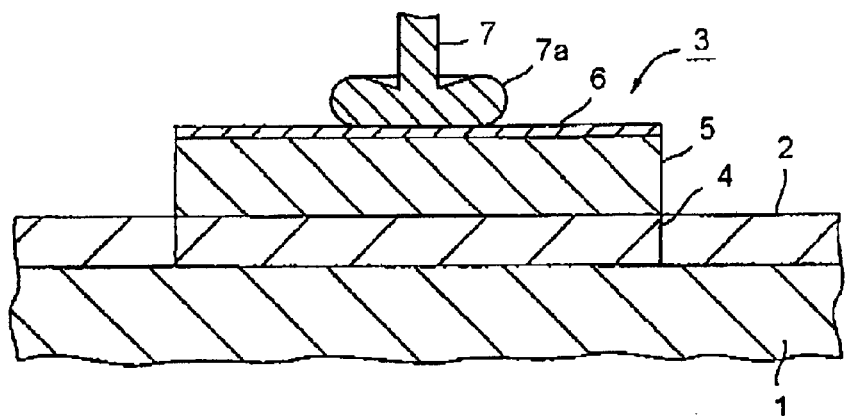
FIG. 1 is an enlarged side sectional view of an essential portion of a related semiconductor device.

In a semiconductor device according to the present invention, the area size of an external electrode layer of a pad electrode made of an internal electrode layer, a barrier metal layer and the external electrode layer, which are deposited in this order, is set midway between the area size of a polymerization portion of a wire on the pad electrode and the size of the planar area of the barrier metal layer. This arrangement is ideally used for a semiconductor device in which a wire formed of gold or an alloy containing gold as a main component is connected to a pad electrode provided with an external electrode layer formed of aluminum or an alloy containing aluminum as a main component. It is to be noted here that the area of the external electrode layer of the pad electrode of the semiconductor device in accordance with the present invention can be preferably set to 1.2 to 2 times of the area of the polymerization portion of the wire.

The semiconductor device according to the present invention may include a superhigh frequency semiconductor element, and may be suitably used for a semiconductor device in which a wire constitutes a part of a superhigh frequency circuit element.

Now, referring now to FIG. 2, an embodiment of the present invention will be explained in detail. In FIG. 2, the like components as those shown in FIG. 1 will be assigned like reference numerals, and the same descriptions will not be repeated.

Referring to FIG. 2, a pad electrode 8 is formed on the surface of a semiconductor substrate 1 comprising semiconductor elements (not shown). The pad electrode 8 is made of an internal electrode layer 4 that is formed of an aluminum alloy containing copper and has a thickness of a few $\mu$m, a barrier metal layer 5 and an external electrode layer 9 formed of an aluminum alloy containing copper. The barrier metal layer 5 is made of a multi-layer laminate of metal layers or alloy layers of titanium or titanium nitride exhibiting barrier properties. A wire 7 formed of gold is connected onto the external electrode layer 9.

Figure 2:
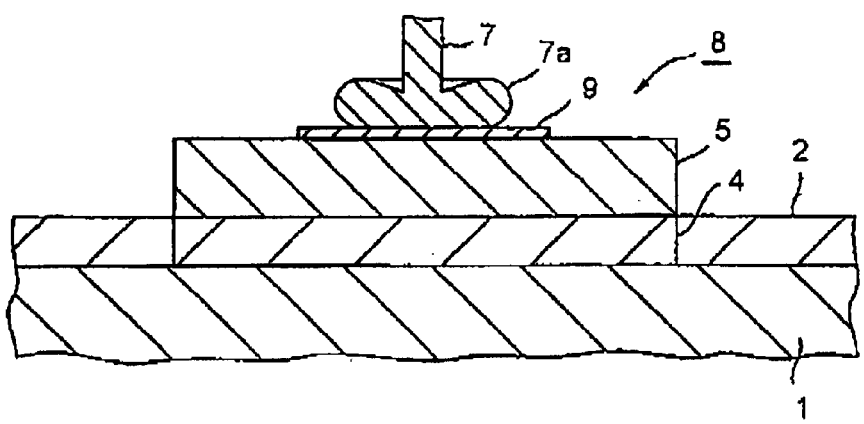
FIG. 2 is an enlarged side sectional view of an essential portion of a semiconductor device according to an embodiment of the present invention.

The semiconductor device according to the present invention differs from the related semiconductor device shown in FIG. 1 in that the size of planar area of the external electrode layer 9 is set midway between the area size of the polymerization portion of the wire 7 on the pad electrode 8 and the size of the planar area of the barrier metal layer 5. By setting the planar area of the external electrode layer 9 in this manner, the external electrode layer 9 is disposed in an island shape on the barrier metal layer 5.

The semiconductor device according to the invention is heated and maintained at a high temperature in a resin molding step and a resin curing step following a wire bonding step until it is shipped out as a completed product. During such heating steps, gold is diffused from the wire 7 into the external electrode layer 9, while aluminum is diffused from the external electrode layer 9 into the wire 7 at the joint interface between the wire 7 and the pad electrode 8. Thus, an intermetallic compound is produced.

In this case, the area of the external electrode layer 9 is smaller than that in the related semiconductor device illustrated in FIG. 1, so that the gold diffused into the aluminum quickly reaches an equilibrium condition, finishing the mutual diffusion. Thus, no additional intermetallic compound is generated. Ending the generation of the intermetallic compound in this manner minimizes time-dependent fluctuation in the resistance between the wire and the pad electrode, Thereby, stability is improved.

The external electrode layer 9 having a diameter of 100 $\mu$m and a thickness of 0.35 $\mu$m was formed on the round barrier metal layer 5 having a diameter of 130 $\mu$m. The wire 7 having a diameter of 25 $\mu$m (the diameter of the bulging portion being about 80 $\mu$m) was connected to the pad electrode 8. The initial value of the wiring resistance was 0.12 Ω. This assembly was left in an atmosphere of 250° C. for 2000 hours to check time-dependent fluctuation in the wiring resistance value. Even after the 2000 hours elapsed, the initial value remained unchanged, indicating extremely high stability.

As in a typical semiconductor device, the joint portion of the wire 7 and the pad electrode 8 of the semiconductor device according to the invention is also heated in a bias test process or the like. However, the resistance at the joint portion remains stable until the device reaches an electrical inspection step. Therefore, no special heating step is required, so that production of the semiconductor device can be readily carried out.

The external electrode layer 9 was formed to have a thickness of 0.35 μm and to have a circular shape of a 100-μm diameter. The diameter of a bulging portion (polymerization portion) 7a of the wire 7 was set to 70 to 90 μm, and the ratio of the area of the external electrode layer 9 to the area of the polymerization portion was changed within the range of 1.2 to 10 to measure time-dependent fluctuation in the wiring resistance. The measurement results indicated that fluctuation from an initial value were suppressed.

If the aforementioned area ratio is set to be larger than 10, that is, if the area of the external electrode layer 9 is increased or the polymerization portion 7a of the wire is decreased, the volume of the external electrode with respect to the wire 7 becomes relatively larger. This causes gold to be diffused from the wire 7 into the external electrode layer 9 for a long time, leading to time-dependent fluctuation in the wiring resistance.

On the contrary, if the area ratio is set to be smaller than 1.2, that is, if the diameter of the external electrode layer 9 is reduced or the area of the wire polymerization portion 7a is increased, the volume of the external electrode layer 9 with respect to the wire 7 is relatively reduced. This is desirable to prevent the time-dependent fluctuation in the wiring resistance because the concentration of gold supplied from the wire 7 quickly reaches a saturation point. Disadvantageously, however, highly accurate wire bonding is required, and if bonding position is inaccurate, a pad electrode may be damaged. For this reason, an appropriate area ratio ranges from 1.2 to 10.

In the semiconductor device according to the present invention, the time-dependent fluctuation in resistance does not occur at the joint portion between the wire 7 and the pad electrode 8. Therefore, even if major current is supplied, voltage does not drop at the joint portion, causing no power loss. Thus, the semiconductor device is suitably used as a power semiconductor device.

Moreover, when operated at superhigh frequencies of a few hundred MHz to GHz, the semiconductor device in accordance with the present invention is capable of maintaining the matching with the circuits connected thereto for a long time period. As a consequence, maintenance operations including readjustment are unnecessary.

Thus, according to the present invention, it is possible to realize a highly reliable semiconductor device without time-dependent fluctuation in the resistance between the wire and the pad electrode, permitting stable operation to last for a long time.

While the present invention has thus far been disclosed in conjunction with several embodiments thereof, it will be readily possible for those skilled in the art to put the present invention into practice in various other manners.

What is claimed is:

1. A semiconductor device having a semiconductor substrate, comprising:

an internal electrode layer formed on the semiconductor substrate, a barrier metal layer formed on the internal electrode, an external electrode layer formed on the barrier metal layer, a pad electrode being made of the internal electrode layer, the barrier metal layer, and the external electrode layer, and a wire which is electrically connected to the pad electrode, wherein an area of the external electrode layer is set midway between an area of a polymerization portion of the wire on the pad electrode and a planar area of the barrier metal layer.

2. The semiconductor device according to claim 1, wherein:

the external electrode layer is made of aluminum or an alloy containing aluminum as a main component.

3. The semiconductor device according to claim 2, wherein:

the wire is made of gold or an alloy containing gold as a main component.

4. The semiconductor device according to claim 1, wherein:

the area of the external electrode layer is set to 1.2 to 10 times of the area of the polymerization portion of the wire.

5. The semiconductor device according to claim 1, wherein:

the semiconductor substrate includes a superhigh frequency circuit device.

6. The semiconductor device according to claim 5, wherein:

the wire constitutes a part of the superhigh frequency circuit device.

7. The semiconductor device according to claim 1, wherein:

the external electrode layer is formed to an island shape on the barrier metal layer.

8. The semiconductor device according to claim 1, wherein:

the area of the external electrode layer of the pad electrode is set so as to suppress time-dependent fluctuation in a resistance between the wire and the pad electrode.

* * * * *